(12) United States Patent
Matsuda

(10) Patent No.: US 10,756,743 B2
(45) Date of Patent: Aug. 25, 2020

(54) ATOMIC OSCILLATOR AND ELECTRONIC DEVICE

(71) Applicant: Murata Manufacturing Co., Ltd., Nagaokakyo-shi, Kyoto-fu (JP)

(72) Inventor: Kenji Matsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 55 days.

(21) Appl. No.: 16/202,378

(22) Filed: Nov. 28, 2018

(65) Prior Publication Data

US 2019/0109597 A1    Apr. 11, 2019

Related U.S. Application Data

(63) Continuation of application No. PCT/JP2017/027674, filed on Jul. 31, 2017.

(30) Foreign Application Priority Data

Oct. 19, 2016    (JP) .................................. 2016-205098

(51) Int. Cl.
*H03L 7/26*    (2006.01)
*H01S 1/06*    (2006.01)
*H03B 17/00*   (2006.01)
*G04F 5/14*    (2006.01)

(52) U.S. Cl.
CPC ................ *H03L 7/26* (2013.01); *G04F 5/145* (2013.01); *H01S 1/06* (2013.01); *H03B 17/00* (2013.01)

(58) Field of Classification Search
CPC ... H03L 7/26; G04F 5/145; G04F 5/14; H03B 17/00
See application file for complete search history.

(56) References Cited

U.S. PATENT DOCUMENTS

| 9,350,368 B2* | 5/2016 | Maki .......................... H03L 7/26 |
| 10,326,461 B2* | 6/2019 | Hayashi .................. H01S 5/005 |
| 2015/0091662 A1* | 4/2015 | Yoshida ................... G04F 5/145 331/94.1 |
| 2015/0349790 A1 | 12/2015 | Maki et al. |

FOREIGN PATENT DOCUMENTS

| JP | 2009-164331 A | 7/2009 |
| JP | 2013-171881 A | 9/2013 |
| JP | 2015-070228 A | 4/2015 |
| JP | 2015-228461 A | 12/2015 |

OTHER PUBLICATIONS

Official Communication issued in International Patent Application No. PCT/JP2017/027674, dated Oct. 17, 2017.

* cited by examiner

*Primary Examiner* — Ryan Johnson
(74) *Attorney, Agent, or Firm* — Keating & Bennett, LLP

(57) ABSTRACT

An atomic oscillator includes a light source, a gas cell including an internal space in which an alkali metal atom is sealed, and a photodetector to detect light emitted from the light source and passing through the gas cell. A radiation region of the light source is wider than a sectional area of the internal space at a distal end of the gas cell relative to the light source.

20 Claims, 7 Drawing Sheets

ATOMIC OSCILLATOR AND ELECTRONIC DEVICE

CROSS REFERENCE TO RELATED APPLICATIONS

This application claims the benefit of priority to Japanese Patent Application No. 2016-205098 filed on Oct. 19, 2016 and is a Continuation Application of PCT Application No. PCT/JP2017/027674 filed on Jul. 31, 2017. The entire contents of each application are hereby incorporated herein by reference.

BACKGROUND OF THE INVENTION

1. Field of the Invention

The present invention relates to an atomic oscillator and an electronic device including the atomic oscillator.

2. Description of the Related Art

Atomic oscillators are able to obtain a resonance frequency through the use of a quantum interference effect (Coherent Population Trapping (CPT)) by radiating two types of laser light having different wave lengths into a gas cell in which atoms, such as rubidium or cesium, are sealed hermetically. It is known that the atom in the gas cell absorbs the laser light and its light absorption characteristic (transmittance) changes depending on a frequency difference between the two types of light. In particular, the atomic oscillator uses a phenomenon that the two types of light pass through the atom without being absorbed (Electromagnetically Induced Transparency (EIT)), thus detecting, as an EIT signal, a spectrum of transmitted light that passes through the atom without being absorbed. A specific structure of the atomic oscillator is disclosed in, for example, Japanese Unexamined Patent Application Publication No. 2009-164331.

The EIT signal to be detected becomes a signal represented by the Lorentzian function at a specific frequency and is more satisfactory as the line width decreases. This means that the atomic oscillator has high accuracy. However, it is known that the EIT signal is influenced by the intensity of light that enters the gas cell. The related-art atomic oscillator has a problem in that the line width of the EIT signal increases due to the influence.

Specifically, a crystal oscillator to be used as a signal source of the atomic oscillator has its oscillation frequency fluctuating depending on an environmental change in terms of temperature or other factors. To make a correction to the fluctuation, an EIT signal at a quantum portion of the atomic oscillator is used. The atomic oscillator detects and corrects the oscillation frequency of the crystal oscillator but, when the line width of the EIT signal is large, the correction is not made unless significant frequency fluctuation occurs. Therefore, a highly accurate oscillator cannot be attained.

SUMMARY OF THE INVENTION

Preferred embodiments of the present invention provide highly accurate atomic oscillators in each of which the line width of an EIT signal to be obtained is smaller and electronic devices including the atomic oscillators.

An atomic oscillator according to a preferred embodiment of the present invention includes a light source, a gas cell including an internal space in which an alkali metal atom is sealed, and a light detecting portion to detect light emitted from the light source and passing through the gas cell. A radiation region of the light source is wider than a sectional area of the internal space at a distal end of the gas cell relative to the light source.

An atomic oscillator according to a preferred embodiment of the present invention includes a light source, a gas cell including an internal space in which an alkali metal atom is sealed, and a light detecting portion to detect light emitted from the light source and passing through the gas cell. A portion of the light emitted from the light source enters the gas cell at a proximal end relative to the light source.

An electronic device according to a preferred embodiment of the present invention includes an atomic oscillator described above.

According to preferred embodiments of the present invention, the radiation region of the light source is wider than the sectional area of the internal space at the distal end of the gas cell relative to the light source or a portion of the light emitted from the light source enters the gas cell at the proximal end relative to the light source. Therefore, an EIT signal having a smaller line width is obtained. Thus, the accuracy is able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
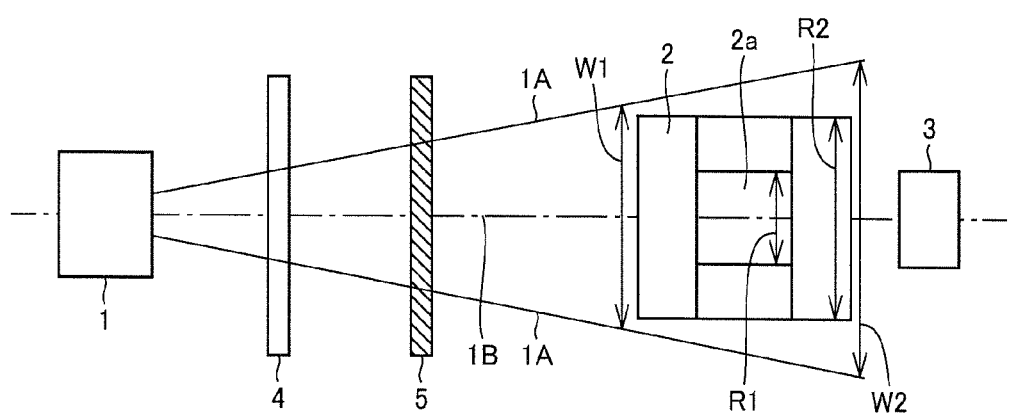
FIG. 1 is a schematic diagram of an atomic oscillator according to a first preferred embodiment of the present invention.

Atomic oscillators according to preferred embodiments of the present invention are described below in detail with reference to the drawings. Note that the same reference symbols in the drawings represent the same or corresponding elements.

First Preferred Embodiment

An atomic oscillator according to a first preferred embodiment of the present invention is described below with reference to the drawings. FIG. 1 is a schematic diagram of an atomic oscillator 100 according to the first preferred embodiment of the present invention. FIG. 1 illustrates the structure of the atomic oscillator 100 regarding a quantum portion within a range from a light source to a photodetector. In addition to the quantum portion, the atomic oscillator includes a light source wave length control circuit and a frequency control circuit described later (see FIG. 2) and, for example, a crystal oscillator defining and functioning as a signal source and a feedback circuit to feed back a signal output from the quantum portion to the crystal oscillator although illustration thereof is not particularly provided. To facilitate the description, the quantum portion of the atomic oscillator is described herein. Further, the quantum portion of the atomic oscillator may simply be referred to as the atomic oscillator in the following description.

The atomic oscillator 100 illustrated in FIG. 1 includes a light source 1, a gas cell 2, a photodetector 3, a wave plate 4, and an ND (Neutral Density) filter 5. The atomic oscillator 100 obtains an EIT signal such that light 1A from the light source 1 enters the gas cell 2 through the wave plate 4 and the ND filter 5, and the photodetector 3 detects light passing through the gas cell 2.

Figure 2:
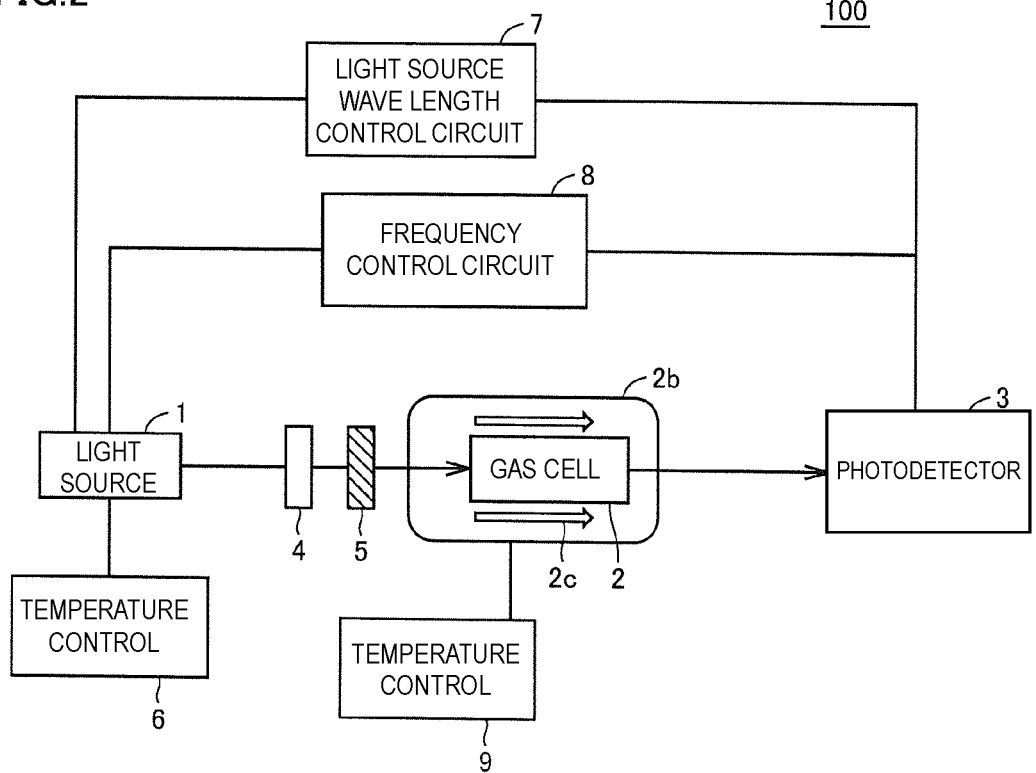
FIG. 2 is a block diagram for describing functions of the atomic oscillator according to the first preferred embodiment of the present invention.

FIG. 2 is a block diagram for describing functions of the atomic oscillator 100 according to the first preferred embodiment of the present invention. In the atomic oscillator 100 illustrated in FIG. 2, temperature control circuits 6 and 9, a light source wave length control circuit 7, and a frequency control circuit 8 that are necessary for driving are illustrated in addition to the structure of the quantum portion of the atomic oscillator 100 illustrated in FIG. 1.

Further, the elements of the atomic oscillator 100 illustrated in FIG. 1 and FIG. 2 are described in detail. For example, a single-mode VCSEL (Vertical Cavity Surface Emitting LASER) is used as the light source 1. Specifically, a Cs-D1 line VCSEL preferably having a light wave length of about 894.6 nm, for example, is used as the light source 1. Note that a Cs-D2 line VCSEL having a light wave length of about 852.3 nm, a Rb-D1 line VCSEL having a light wave length of about 795.0 nm, a Rb-D2 line VCSEL having a light wave length of about 780.2 nm, or other suitable VCSEL may be used as the light source 1. Further, the light source 1 is not limited to the VCSELs, and a DFB (Distributed Feedback) laser, a DBR (Distributed Bragg Reflector) laser, or other suitable laser may be used.

When the VCSEL is used as the light source 1, adjustment is performed using the temperature control circuit 6 so that light having a wave length of about 894.6 nm is able to be output because the light wave length varies due to individual differences of the VCSEL. The temperature control circuit 6 adjusts a temperature with a heater provided to the light source 1 based on a temperature measured by a thermistor or a thermocouple provided near the light source 1. Note that a method of adjusting an operating current may be used instead of the temperature adjustment as the method for controlling the wave length of light to be output from the VCSEL.

The light from the light source 1 passes through the wave plate 4 and the ND filter 5 before the light enters the gas cell 2. The wave plate 4 is used to change polarization of the light from the light source 1. The light emitted from the light source 1 is linearly polarized light in general. The EIT signal obtained by using the linearly polarized light is likely to cause frequency fluctuation because of the use of an energy level at which significant fluctuation occurs due to an external magnetic field. Thus, a level at which the frequency fluctuation caused by the external magnetic field is small is used in the atomic oscillator in general. Accordingly, the wave plate 4 is used and the linearly polarized light from the light source 1 is changed into circularly polarized light by the wave plate 4 to enter the gas cell 2. Note that the circularly polarized light obtained through conversion by the wave plate 4 may be right-handed circularly polarized light or left-handed circularly polarized light.

The ND filter 5 is an optical component that attenuates the intensity of the light from the light source 1. In the atomic oscillator, a power broadening effect that the line width of the EIT signal increases when the intensity of the light that enters the gas cell is extremely high is known. Therefore, even if a VCSEL of several mW or less is used as the light source 1, an ND filter 5 having a transmittance of about 30% or less, for example, is preferably used to obtain a satisfactory EIT signal (the line width of the EIT signal is small). Note that, if the intensity of the light that enters the gas cell 2 is attenuated excessively by the ND filter 5, the EIT signal itself cannot be observed and, therefore, an optimum ND value needs to be set in consideration of a detection limit of the EIT signal. The ND filter 5 may be a reflection filter in which a metal film is deposited on a glass substrate to reflect light or an absorption type in which a material itself absorbs light.

The gas cell 2 is a hermetic container in which an alkali metal gas (atoms) of K, Na, Cs, Rb, or other alkali gas is hermetically sealed. The gas cell 2 includes an entrance window (entrance side) at which light enters the gas cell 2 at the proximal end relative to the light source 1, an exit window (exit side) at which light exits the gas cell 2 at the distal end, and lateral walls (lateral surfaces) that define the entrance window and the exit window. An alkali metal gas preferably of Cs or Rb, for example, is sealed hermetically in the gas cell of the atomic oscillator. If the size of the gas cell 2 is about 10 mm or less, the gas cell 2 is heated by adjusting a heater or other heating device by the temperature control circuit 9 to increase the amount of the alkali metal gas in an internal space 2a. For example, the temperature of the gas cell to be used for the atomic oscillator is preferably about 30° C. to about 125° C. The temperature control circuit 9 adjusts the temperature with the heater provided to the gas cell 2 based on a temperature measured by a thermistor or a thermocouple provided near the gas cell 2.

The amount of the alkali metal gas that is required in the gas cell 2 is an amount at a saturation vapor pressure. However, the alkali metal gas is gradually consumed due to, for example, reaction with the container of the gas cell 2 and, therefore, an alkali metal gas in an amount larger than the amount at the saturation vapor pressure is sealed in the gas cell 2. Specifically, in a gas cell having a length of about several mm on each side, an alkali metal of about several μg is sealed in the gas cell 2. Note that the alkali metal sealed in an amount larger than the amount at the saturation vapor pressure stays in the internal space 2a in a solid or liquid state.

The gas cell 2 is transparent at least on an optical path in order that the light from the light source 1 enter the gas cell 2. Therefore, glass such as quartz glass, borosilicate glass, or aluminosilicate glass, for example, is preferably used for the entrance and exit windows of the gas cell 2. Note that glass or Si that is able to be bonded to glass by anodic bonding is preferably used for the lateral surfaces of the gas cell 2.

A more satisfactory EIT signal is able to be obtained as the container size of the gas cell 2 is larger both in an optical axis direction and in a direction perpendicular or substantially perpendicular to the optical axis. This is because the region at which the alkali metal gas is irradiated with light expands in the gas cell 2 and the time of light irradiation of the alkali metal gas increases. However, a small-size atomic oscillator is demanded and the container size of the gas cell preferably has, for example, a length of about 1 mm to about 10 mm on each side.

A buffer gas is sealed in the gas cell 2 in addition to the alkali metal gas. If only the alkali metal gas is in the gas cell, a problem arises in that the observation time decreases because the alkali metal atom impinges on the container wall within a short time. Therefore, an inert gas called buffer gas is sealed in the gas cell together with the alkali metal gas to increase the observation time. Thus, the alkali metal gas impinges on the buffer gas to reduce its moving speed and increase the time required to impinge on the container wall. Accordingly, the observation time is increased. The inert gas to be sealed is preferably He, $N_2$, Ne, Ar, Kr, or Xe, for example. An inert gas of about 300 Torr or less, for example, is preferably sealed in the gas cell. Note that inert gases having different temperature characteristics are simultaneously sealed to reduce influence of the temperature characteristic of the buffer gas on the EIT signal. For example, Ar having a negative temperature characteristic and $N_2$ having a positive temperature characteristic are preferably simultaneously sealed in the gas cell.

In the gas cell 2, preferably, for example, Cs is sealed as the alkali metal gas and a mixed gas of Ar and Ne (the ratio between Ar and Ne is about 7:3 and the total pressure is about 75 Torr) is sealed as the buffer gas. Further, preferably, for example, the operating temperature of the gas cell 2 is about 70° C. and the container size of the gas cell 2 is about 2 mm in terms of the length in the optical axis direction.

It is known that, when an external magnetic field is applied to the gas cell 2, the energy level of the alkali metal undergoes Zeeman splitting and a plurality of EIT signals are obtained. Therefore, the gas cell 2 includes a magnetic shield 2b and a device to apply a bias field 2c to reduce the influence of the external magnetic field. A magnetic material, such as electromagnetic soft iron, silicon steel, permalloy, or an amorphous material, for example, is preferably used for the magnetic shield 2b. The bias field 2c is applied in the optical axis direction preferably using a three-axis Helmholtz coil (not illustrated), for example. Note that the device to apply the bias field 2c to the gas cell 2 is not limited to the Helmholtz coil.

A PD (photo diode) is used for the photodetector 3. The PD converts light into a current and is preferably, for example, a PIN photo diode of Si having an absorption band at a near-infrared wave length. The PIN photo diode is able to respond at high speed by applying a reverse bias voltage. In a case of using the PIN photo diode for the atomic oscillator, the reverse bias voltage is not applied because the high-speed response is not particularly required.

The photodetector 3 detects a peak position of the EIT signal and a peak position of an absorption line based on a signal obtained by the PD. To obtain a satisfactory EIT signal, CPT needs to occur at the peak position of the absorption line. The peak position of the absorption line corresponds to the wave length of the light from the light source 1.

The light source wave length control circuit 7 controls the wave length of the light from the light source 1. Specifically, the light source wave length control circuit 7 corrects a current (or a voltage) of a DC power supply (not illustrated) based on the peak position of the absorption line that is obtained by the photodetector 3 and performs control so that the wave length of the light from the light source 1 is stabilized at the peak position of the absorption line.

The frequency control circuit 8 generates an RF signal to be superimposed on a drive current of the light source 1 based on a signal acquired from the photodetector 3 and controls the frequency of the RF signal so that the inside of the gas cell 2 is brought into a CPT state. Specifically, the frequency control circuit 8 generates an RF signal that is input to the light source 1 and preferably has about 4.596315885 kHz, for example, based on a signal (about 10 MHz) of a temperature compensated crystal oscillator (TCXO) by using a voltage controlled oscillator (VCO) and a phase lock loop (PLL). Note that the frequency control circuit 8 modulates the frequency of the RF signal (for example, 10 kHz) and sweeps the wave length of the light from the light source 1 so that the photodetector 3 is able to detect the peak position of the EIT signal and the peak position of the absorption line.

The atomic oscillator 100 according to the first preferred embodiment is structured so that the intensity of the light that enters the gas cell 2 from the light source 1 becomes uniform by reassessing the positional relationship between the light source 1 and the gas cell 2.

In a case of laser light of the VCSEL to be used as the light source 1, the light intensity increases toward a central portion. The light intensity has a Gaussian distribution in the direction perpendicular or substantially perpendicular to the optical axis. Therefore, the light source 1 has a characteristic that a difference in the light intensity decreases at a peripheral portion located at a constant distance from the central portion of the light source 1 (for example, about 1 mm from the central portion) as a spot diameter (radiation region) increases. Using this characteristic, the intensity of the light that enters the gas cell 2 is made uniform by increasing the spot diameter of the light source 1 in the atomic oscillator 100 according to the first preferred embodiment.

Now, a description is provided of the reasons why the line width of the EIT signal increases if the intensity of the light that enters the gas cell 2 is not uniform. First, power broadening is conceivable as one reason. The power broadening is a phenomenon that the line width of the EIT signal increases as the density of the intensity of the light that enters the alkali metal gas of Cs, for example, increases.

Therefore, if the light intensity is not uniform, the line width of the EIT signal increases due to the power broadening caused in a region at which the density of the light intensity is high, thus influencing the line width of the EIT signal in the entire region.

Next, a light shift is conceivable as one reason. The light shift is a phenomenon that an energy level unique to the alkali metal gas changes due to influence of light if the light enters the alkali metal gas. The amount of change in the energy level due to the light shift differs depending on the light intensity. Therefore, if the light intensity is not uniform, the amount of change in the energy level due to the light shift differs between a region at which the light intensity is high and a region at which the light intensity is low, thus influencing the line width of the EIT signal.

Specifically, in the atomic oscillator 100 according to the first preferred embodiment, the value of the spot diameter of the light source 1 relative to the container size of the gas cell 2 is reassessed to make the light intensity uniform. In the atomic oscillator 100 illustrated in FIG. 1, for example, when an inner diameter R1 of the gas cell 2 is about 2 mm and a width R2 of the gas cell 2 is about 4 mm, a spot diameter W1 of the light source 1 on the entrance side of the gas cell 2 is larger than about 4 mm. That is, the spot diameter W1 of the light source 1 on the entrance side of the gas cell 2 is larger than the inner diameter R1 of the gas cell 2 and the width R2 of the gas cell 2. Note that the cross-sectional shape of the gas cell 2 is square or substantially square and the length of one side of the outer shape is the width R2 of the gas cell 2. The spot diameter of the light source 1 increases in the optical axis direction and, therefore, a spot diameter W2 of the light source 1 on the exit side of the gas cell 2 is even larger than the spot diameter W1.

Figure 3:
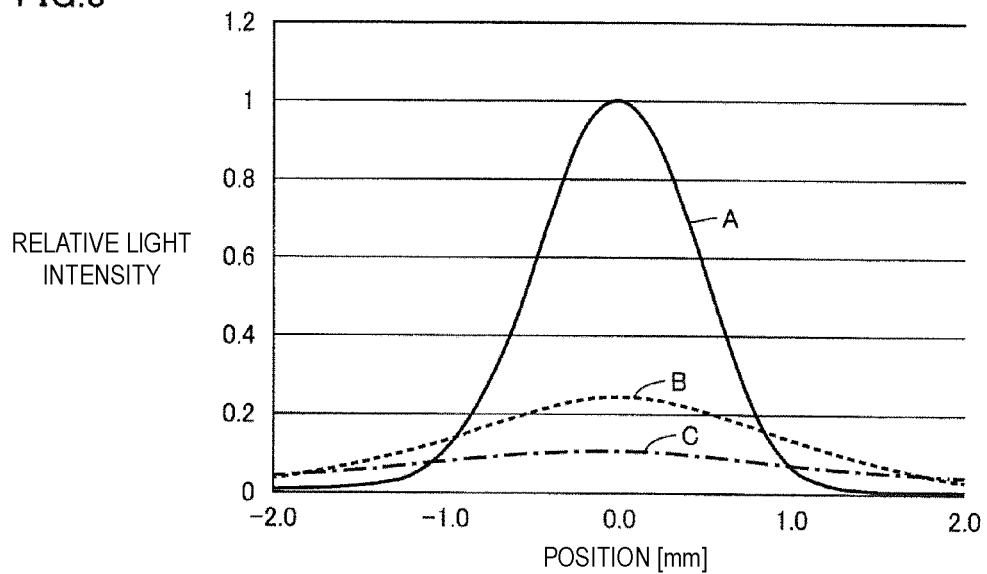
FIG. 3 is a diagram for describing a relationship between a relative light intensity and a position with respect to a spot diameter of a light source.

Now, description is further provided of a relationship between the spot diameter of the light source 1 and the light intensity. FIG. 3 is a diagram for describing a relationship between a relative light intensity and a position with respect to the spot diameter of the light source 1. FIG. 3 illustrates a graph A in a case in which the spot diameter of the light source 1 is about 2 mm, a graph B in a case in which the spot diameter of the light source 1 is about 3 mm, and a graph C in a case in which the spot diameter of the light source 1 is about 4 mm. In the case of the graph A, the relative light intensity is about 1.0 at the central portion of the light source 1 (position of about 0.0 mm) and is about 0.1 at the peripheral portion of the light source 1 (position of about ±1.0 mm), thus exhibiting a significant change. In the case of the graph B, however, the relative light intensity is about 0.25 at the central portion of the light source 1 (position of about 0.0 mm) and is about 0.15 at the peripheral portion of the light source 1 (position of about ±1.0 mm), thus exhibiting a small change. Further, in the case of the graph C, the relative light intensity is about 0.1 at the central portion of the light source 1 (position of about 0.0 mm) and is about 0.1 at the peripheral portion of the light source 1 (position of about ±1.0 mm), thus exhibiting an even smaller change.

Figure 4:
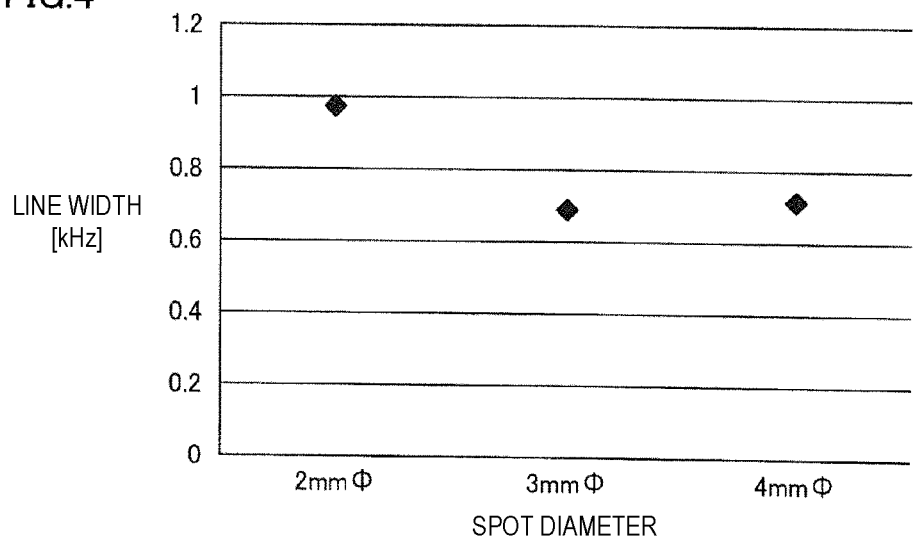
FIG. 4 is a diagram for describing a relationship between the spot diameter of the light source and a line width of an EIT signal.

Therefore, the atomic oscillator 100 is able to obtain a satisfactory EIT signal such that the intensity of the light in the gas cell 2 is made uniform by increasing the spot diameter of the light on the entrance side of the gas cell 2. Specifically, FIG. 4 is a diagram for describing a relationship between the spot diameter of the light source 1 and the line width of the EIT signal. FIG. 4 illustrates results of measurement of the line width of the EIT signal in the cases in which the spot diameter of the light source 1 is about 2 mm, about 3 mm, and about 4 mm. Note that the measurement of FIG. 4 is adjusted so that the quantity of the light radiated from the light source 1 into the internal space 2a in the gas cell 2 becomes constant even when the spot diameter is changed to about 2 mm, about 3 mm, and about 4 mm. When the spot diameter of the light source 1 is about 2 mm, the line width of the EIT signal is about 1 kHz. When the spot diameter of the light source 1 is about 3 mm, the line width of the EIT signal decreases to about 0.7 kHz. Further, when the spot diameter of the light source 1 is about 4 mm, the line width of the EIT signal decreases to about 0.7 kHz. Thus, the spot diameter of the light source 1 is preferably, for example, about 1.5 times or more as large as the inner diameter R1 of the internal space 2a of the gas cell 2.

To increase the spot diameter of the light source 1 on the entrance side of the gas cell 2, the atomic oscillator 100 is adjusted by changing a distance between the light source 1 and the gas cell 2. Note that a general definition that the spot diameter of the light source 1 falls within a range in which the light intensity becomes about $1/e^2$ as high as a peak light intensity is used.

Figure 5:
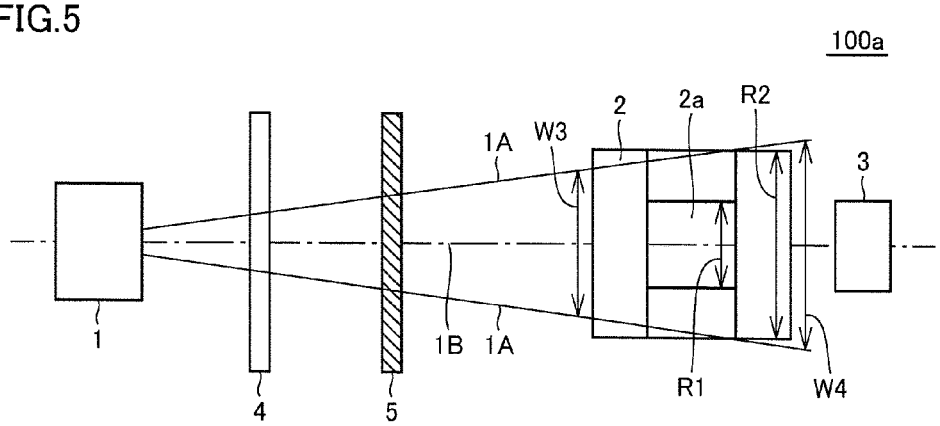
FIG. 5 is a schematic diagram of an atomic oscillator according to a modified example of the first preferred embodiment of the present invention.

In the atomic oscillator 100 illustrated in FIG. 1, a description is provided of the example in which the spot diameter W1 of the light source 1 on the entrance side of the gas cell 2 is larger than the width R2 of the gas cell 2. The atomic oscillator is not limited thereto. It is only necessary in the atomic oscillator that at least the spot diameter of the light source on the exit side of the gas cell is larger than the width of the gas cell and the spot diameter of the light source on the entrance side of the gas cell may be smaller than the width of the gas cell. Specifically, FIG. 5 is a schematic diagram of an atomic oscillator 100a according to a modified example of the first preferred embodiment of the present invention. In the atomic oscillator 100a, a spot diameter W4 of the light source 1 on the exit side of the gas cell 2 is larger than the width R2 of the gas cell 2. In the atomic oscillator 100a, however, a spot diameter W3 of the light source 1 on the entrance side of the gas cell 2 is smaller than the width R2 of the gas cell 2. Note that the container of the gas cell 2 has a thickness and the size of the internal space 2a in the gas cell 2 is smaller than the container size. That is, the inner diameter R1 of the gas cell 2 is smaller than the width R2 of the gas cell 2. Therefore, if the definition is made strictly, it is only necessary in the atomic oscillator 100a that the spot diameter W4 of the light source 1 on the exit side of the gas cell 2 is larger than the inner diameter R1 of the gas cell 2. Note that the internal space 2a preferably has a columnar shape inside the gas cell 2 having a rectangular or substantially rectangular solid shape and the cross-sectional shape of the internal space 2a is a circular or substantially circular shape having the inner diameter R1.

As described above, the atomic oscillators 100 and 100a according to the first preferred embodiment are able to obtain a satisfactory EIT signal when at least the spot diameters W2 and W4 of the light source 1 on the exit side of the gas cell 2 are larger than the inner diameter R1 of the gas cell 2. That is, in the atomic oscillators 100 and 100a, the radiation region of the light source 1 (area based on the spot diameters W2 and W4 of the light source 1) is wider than the sectional area of the internal space 2a (area based on the inner diameter R1) at the distal end of the gas cell 2 relative to the light source 1 (on the exit side of the gas cell 2). Therefore, the atomic oscillators 100 and 100a according to the first preferred embodiment are highly accurate atomic oscillators because the line width of the EIT signal to be obtained is smaller.

As illustrated in FIG. 1 and FIG. 5, in the atomic oscillators 100 and 100a, only a portion of the light emitted from the light source 1 enters the gas cell 2 at the proximal end relative to the light source 1 (on the entrance side of the gas cell 2). That is, a central portion of the light emitted from the light source 1 enters the gas cell 2 but a peripheral portion of the light does not enter the gas cell 2. It is necessary that the spot diameter of the light source 1 on the entrance side of the gas cell 2 is smaller than the inner diameter R1 of the gas cell 2 if the light from the light source 1 is used effectively. In the atomic oscillators 100 and 100*a* according to the first preferred embodiment, however, the light is not used effectively but only a portion of the light emitted from the light source 1 is caused to enter the gas cell 2 in order to make the light intensity uniform. Therefore, the atomic oscillators 100 and 100*a* are able to obtain a satisfactory EIT signal because the line width of the EIT signal decreases.

Figure 6A:
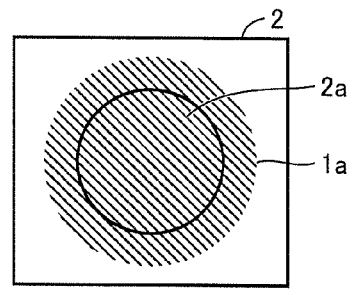
FIGS. 6A and 6B are schematic diagrams for describing relationships between the shape of an internal space and the spot diameter of the light source according to a modified example of the first preferred embodiment of the present invention.
Figure 6B:
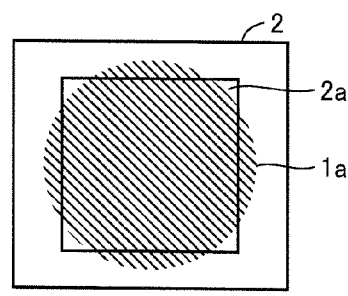

It is described that the shape of the gas cell 2 is the rectangular or substantially rectangular solid shape having the width R2 and the shape of the internal space 2*a* is the columnar shape having the inner diameter R1. The shapes are not limited thereto. For example, the shape of the gas cell 2 may be a columnar shape or the shape of the internal space 2*a* may be a rectangular or substantially rectangular solid shape. Even if the shape of the internal space 2*a* is the rectangular or substantially rectangular solid shape, it is only necessary in the atomic oscillators 100 and 100*a* that the radiation region of the light source 1 is wider than the sectional area of the internal space 2*a* at the distal end of the gas cell 2 relative to the light source (on the exit side of the gas cell 2). If the shape of the internal space 2*a* is the rectangular or substantially rectangular solid shape, the internal space 2*a* may partially include a portion into which the light does not enter. Specifically, FIGS. 6A and 6B are schematic diagrams for describing relationships between the shape of the internal space 2*a* and the spot diameter of the light source 1 according to a modified example of the first preferred embodiment of the present invention. FIG. 6A illustrates a relationship between the cross section of the internal space 2*a* and a spot 1*a* of the light source 1 in an example in which the shape of the internal space 2*a* is the columnar shape. The spot 1*a* of the light source 1 covers the entire cross section of the internal space 2*a*. On the other hand, FIG. 6B illustrates a relationship between the cross section of the internal space 2*a* and the spot 1*a* of the light source 1 in an example in which the shape of the internal space 2*a* is the rectangular or substantially rectangular solid shape. The spot 1*a* of the light source 1 cannot cover the entire cross section of the internal space 2*a* but there partially remain portions into which the light does not enter. However, the area of the spot 1*a* of the light source 1 (radiation region of the light source 1) is wider than the sectional area of the internal space 2*a*.

Second Preferred Embodiment

As illustrated in FIG. 3, when the spot diameter of the light source 1 is small, the light intensity changes significantly even if a slight deviation occurs from the central portion of the light source 1 but, when the spot diameter of the light source 1 is large, the change in the light intensity is small even if a slight deviation occurs from the central portion of the light source 1. This means that the intensity of the light that enters the gas cell does not change in the atomic oscillator even if the optical axis of the light source deviates from a central axis of the gas cell. This demonstrates that the resistance to the deviation of the optical axis (misalignment) increases.

Figure 7:
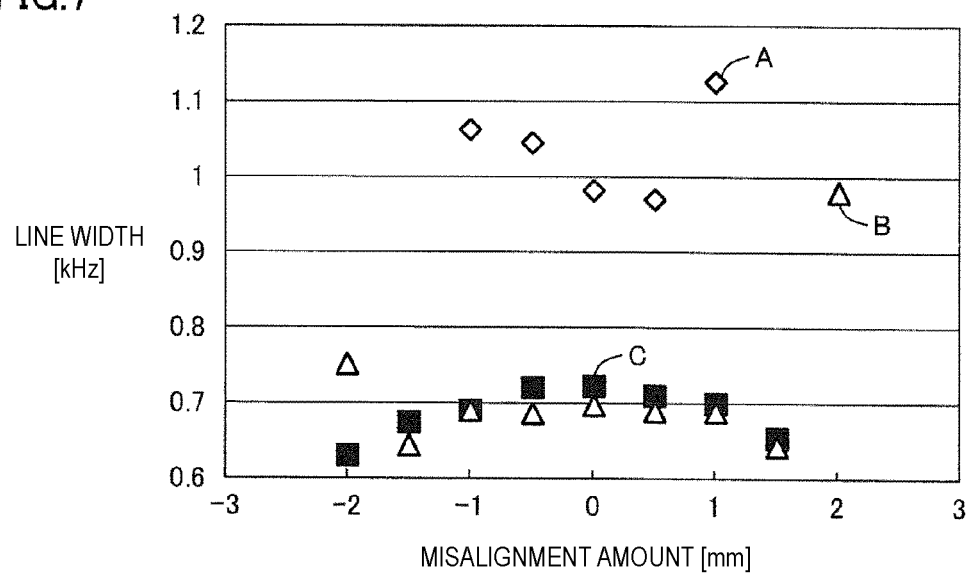
FIG. 7 is a diagram for describing a relationship between a misalignment amount and the line width of the EIT signal.

FIG. 7 is a diagram for describing a relationship between a misalignment amount and the line width of the EIT signal. In FIG. 7, points A represent results of measurement of changes in the misalignment amount and the line width of the EIT signal in the case in which the spot diameter of the light source 1 is about 2 mm. Similarly, in FIG. 7, points B and points C represent results of measurement of changes in the misalignment amount and the line width of the EIT signal in the cases in which the spot diameter of the light source 1 is about 3 mm and about 4 mm, respectively. Specifically, in the case in which the spot diameter of the light source 1 is about 2 mm (points A), the line width of the EIT signal is about 1 kHz when the optical axis of the light source coincides with the central axis of the gas cell (misalignment amount of about 0 mm). However, the line width of the EIT signal is about 1.08 kHz when the misalignment amount is −1 mm, and is about 1.12 kHz when the misalignment amount is about 1 mm, thus exhibiting a significant change. In the case in which the spot diameter of the light source 1 is about 3 mm (points B), on the other hand, the line width of the EIT signal is about 0.7 kHz and is substantially constant even when the misalignment amount is about 0 mm and about ±1 mm. Similarly, in the case in which the spot diameter of the light source 1 is about 4 mm (points C), the line width of the EIT signal is about 0.7 kHz and is substantially constant even when the misalignment amount is about 0 mm and about ±1 mm. Note that, when the misalignment amount is about ±2 mm, the influence on the line width of the EIT signal is reduced or minimized in the case in which the spot diameter of the light source 1 is about 4 mm (points C).

Figure 8:
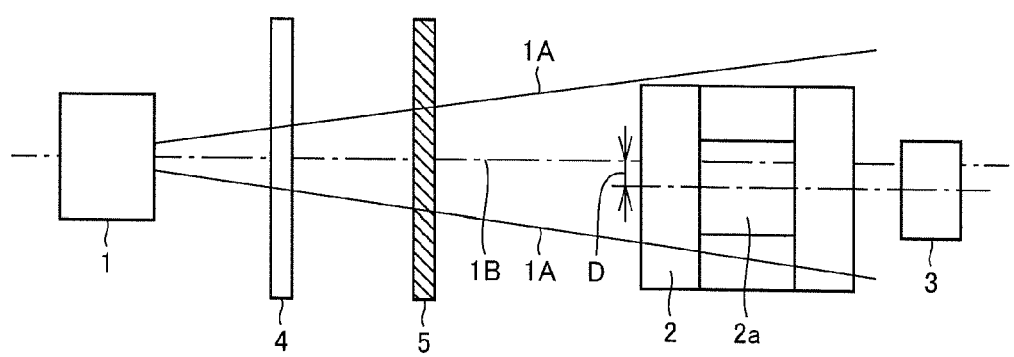
FIG. 8 is a schematic diagram of an atomic oscillator according to a second preferred embodiment of the present invention.

By using the fact that the resistance to the misalignment is increased by causing the light from the light source to enter the gas cell uniformly as described above, the atomic oscillator may have a structure in which the optical axis of the light source is caused to deviate from the central axis of the gas cell. FIG. 8 is a schematic diagram of an atomic oscillator 100*b* according to a second preferred embodiment of the present invention. The atomic oscillator 100*b* has a structure in which an optical axis 1B of the light source 1 deviates from the central axis of the gas cell 2. Note that, in the atomic oscillator 100*b*, the same or corresponding components as those of the atomic oscillator 100 illustrated in FIG. 1 are represented by the same reference symbols detailed description thereof is omitted.

In the atomic oscillator 100*b*, D represents a deviation amount between the optical axis 1B of the light source 1 and the central axis of the gas cell 2. Even when the deviation amount D is about 1 mm, the atomic oscillator 100*b* is able to obtain a satisfactory EIT signal as illustrated in FIG. 7 as long as at least the spot diameter of the light source 1 on the exit side of the gas cell 2 is larger than the inner diameter of the gas cell 2.

Third Preferred Embodiment

Figure 9:
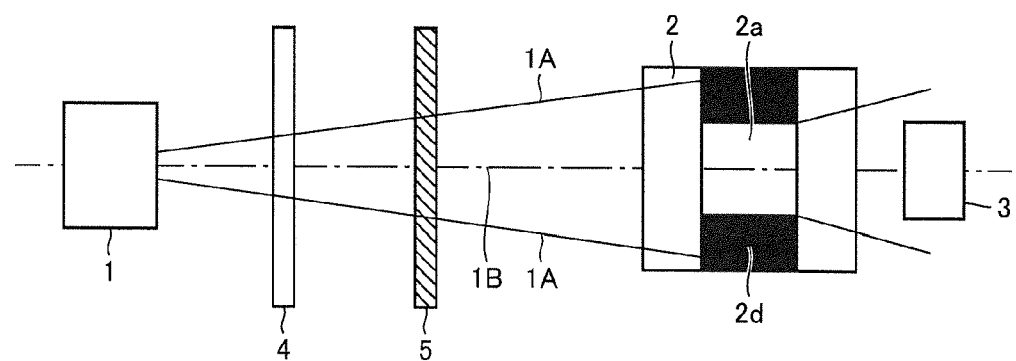
FIG. 9 is a schematic diagram of an atomic oscillator according to a third preferred embodiment of the present invention.

In the atomic oscillators 100 and 100*a* according to the first preferred embodiment, a portion of the light emitted from the light source 1 enters the gas cell 2 at the proximal end relative to the light source 1 (on the entrance side of the gas cell 2). Thus, light that does not enter the internal space 2*a* of the gas cell 2 is present in the light emitted from the light source 1. This light may be detected by the photodetector 3. The light detected by the photodetector 3 becomes a noise component for the EIT signal. Therefore, description is provided of an atomic oscillator having a structure in which the photodetector does not detect the light that does not enter the internal space. FIG. 9 is a schematic diagram of an atomic oscillator 100c according to a third preferred embodiment of the present invention. Note that, in the atomic oscillator 100c, the same or corresponding components as those of the atomic oscillator 100 illustrated in FIG. 1 are represented by the same reference symbols detailed description thereof is omitted.

In the atomic oscillator 100c, a light blocking portion 2d is provided at the lateral walls (lateral surfaces) of the gas cell 2. The light blocking portion 2d interrupts an optical path to the photodetector 3 such that the light that does not enter the internal space 2a is prevented from passing through the light blocking portion 2d toward an outer side portion of the gas cell 2. Note that the light blocking portion 2d may preferably be a light absorbing member or a light reflecting member, for example. Specifically, for example, Si or a metal film may be as the light blocking portion 2d.

For example, in the case in which Si is used as the light blocking portion 2d, an absorption coefficient α is about 300 $cm^{-1}$ to about 400 $cm^{-1}$ when the light wave length is about 894 nm. By using the absorption coefficient α, a light intensity I(x) in a case in which the light that enters the light blocking portion 2d (light intensity I0) travels in the light blocking portion 2d by x cm may be represented by I(x)=I0 exp(−αx). The light blocking portion 2d preferably has an absorption amount of about 90% or more, for example, in terms of design. It is preferable that the absorption coefficient α be about 23 $cm^{-1}$ or more when the thickness of the light blocking portion 2d is about 1 mm, for example.

Figure 10:
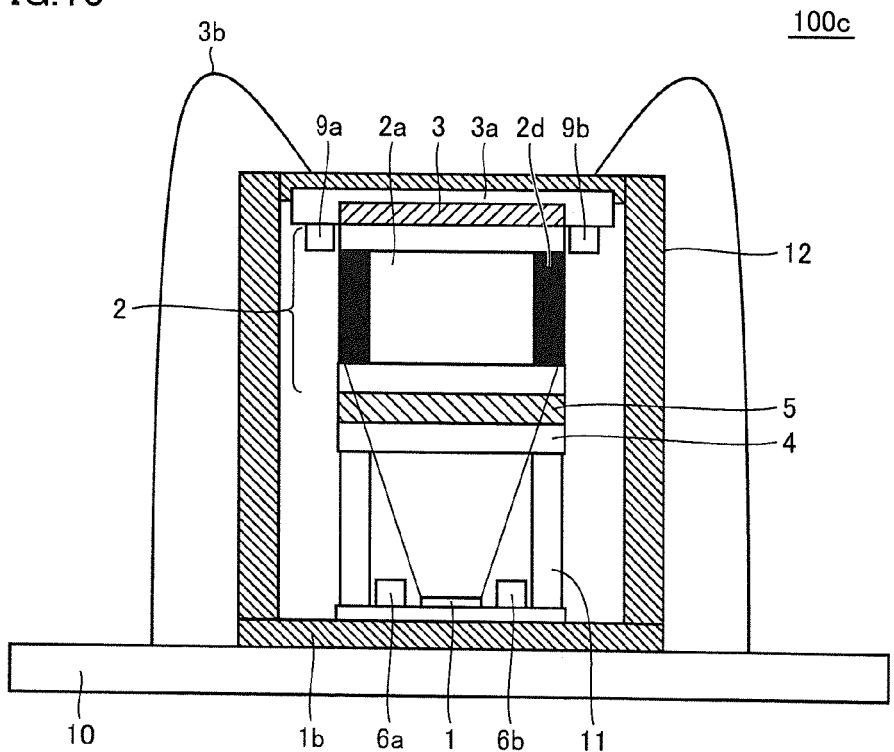
FIG. 10 is a cross-sectional view for describing a device structure of the atomic oscillator according to the third preferred embodiment of the present invention.

Next, description is provided of a case in which the atomic oscillator 100c is structured as a specific device. FIG. 10 is a cross-sectional view for describing a device structure of the atomic oscillator according to the third preferred embodiment of the present invention. Note that, in the atomic oscillator 100c illustrated in FIG. 10, the same or corresponding components as those of the atomic oscillator 100 illustrated in FIG. 1 are represented by the same reference symbols detailed description thereof is omitted. First, the atomic oscillator 100c includes the light source 1 provided to a printed circuit board 1b that is disposed on a circuit board 10 and light is radiated upward in FIG. 10 to enter the gas cell 2. A VCSEL is mounted on the printed circuit board 1b to define the light source 1. A wiring pattern to connect a heater 6a and a thermistor 6b to be used to adjust the temperature of the VCSEL is provided on the printed circuit board 1b. The heater 6a and the thermistor 6b are connected to the temperature control circuit 6.

Because of the structure in which the light is radiated upward to enter the gas cell 2, the gas cell 2 is provided above the light source 1 with a spacer 11 interposed therebetween. The spacer 11 supports the gas cell 2 and maintains a constant optical axis position and a constant distance relative to the light source 1. Therefore, the spot diameter of the light source 1 is able to be adjusted by the height of the spacer 11.

The photodetector 3 provided to a printed circuit board 3a is disposed on the exit side of the gas cell 2. A PD is mounted on the printed circuit board 3a to define the photodetector 3. A wiring pattern to connect a heater 9a and a thermistor 9b to be used to adjust the temperature of the gas cell 2 is provided on the printed circuit board 3a. The heater 9a and the thermistor 9b are connected to the temperature control circuit 9.

The light source 1, the gas cell 2, the photodetector 3, and other components of the atomic oscillator 100c are collectively packaged using a ceramic member 12. The ceramic member 12 is electrically conductive to the printed circuit boards 1b and 3a and is connected to wiring of the circuit board 10. The printed circuit board 3a and the circuit board 10 are connected to each other with a wire 3b interposed therebetween. The inside of the package including the ceramic member 12 may be vacuum-sealed to increase the efficiency of the heaters 6a and 9a.

Figure 11:
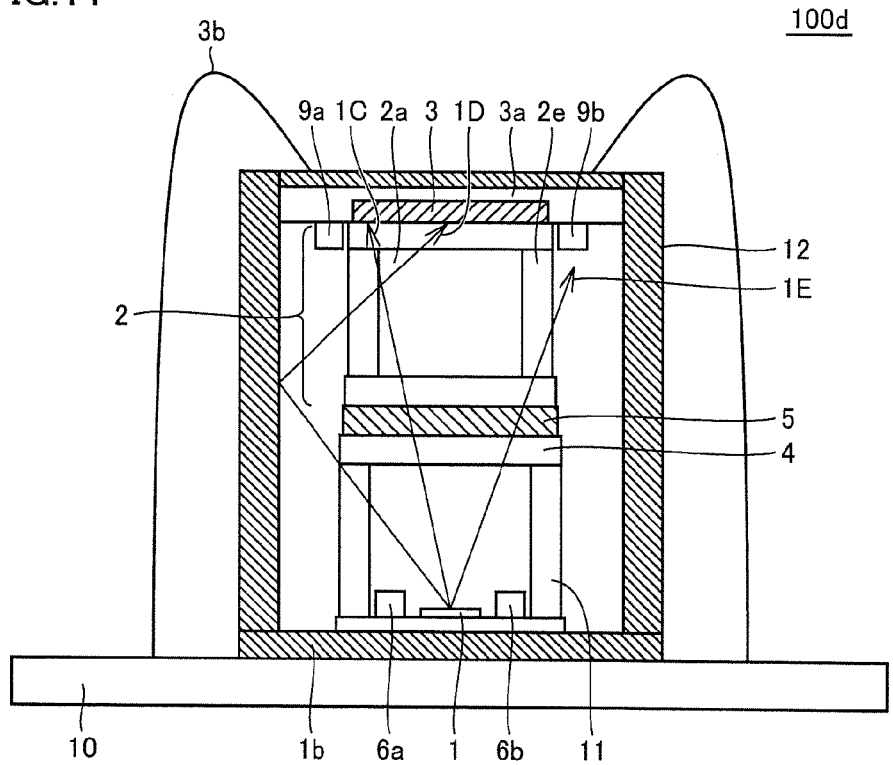
FIG. 11 is a cross-sectional view for describing another device structure of the atomic oscillator according to the third preferred embodiment of the present invention.

Next, description is provided of how the light blocking portion 2d functions in the atomic oscillator 100c illustrated in FIG. 10. To facilitate understanding of the description, another device structure in which the light blocking portion 2d is not provided is illustrated. FIG. 11 is a cross-sectional view for describing another device structure of an atomic oscillator 100d according to the third preferred embodiment of the present invention. The atomic oscillator 100d illustrated in FIG. 11 has the same or substantially the same structure except that the gas cell 2 does not include the light blocking portion 2d.

First, the atomic oscillator 100d is able to obtain the EIT signal through an optical path 1C on which the light emitted from the light source 1 passes through the internal space 2a of the gas cell 2 to reach the photodetector 3. Since the atomic oscillator 100d does not include the light blocking portion 2d, however, there is an optical path 1D, for example, on which the light emitted from the light source 1 is reflected on the ceramic member 12 to enter the gas cell 2 through the lateral surface and passes through the internal space 2a of the gas cell 2 to reach the photodetector 3. The light detected by the photodetector 3 without properly passing through the internal space 2a of the gas cell 2 along the optical path 1D, for example, becomes a noise component for the EIT signal. Thus, the atomic oscillator 100d cannot obtain a satisfactory EIT signal. Therefore, the atomic oscillator 100c illustrated in FIG. 10 obtains a satisfactory EIT signal such that the light blocking portion 2d is provided to the gas cell 2 to prevent the photodetector 3 from detecting the light traveling along the optical path 1D, for example.

Since the atomic oscillator 100d does not include the light blocking portion 2d, there is also an optical path 1E, for example, on which the light emitted from the light source 1 passes through the lateral surface of the gas cell 2 to reach the thermistor 9b. In the atomic oscillator 100d, the thermistor 9b to sense a temperature is disposed near the gas cell 2 as illustrated in FIG. 11. If unnecessary light impinges on the thermistor 9b, there is a risk that the temperature cannot be measured accurately. Therefore, the atomic oscillator 100c illustrated in FIG. 10 prevents an erroneous operation of the thermistor 9b such that the light blocking portion 2d is provided to the gas cell 2 to prevent the light traveling along the optical path 1E, for example, from impinging on the thermistor 9b. In particular, the spot diameter of the light source 1 on the entrance side of the gas cell 2 is set smaller than the width of the gas cell as illustrated in FIG. 10. Thus, there is no light that travels out of the gas cell. Further, the erroneous operation of the thermistor 9b due to the light radiated into the gas cell 2 is able to be prevented by providing the light blocking portion 2d. For example, when the width R2 of the gas cell 2 is about 3 mm to about 5 mm, the spot diameter of the light source 1 on the entrance side of the gas cell 2 is preferably equal to or smaller than about 3 mm to about 5 mm, for example.

As described above, in the atomic oscillator 100c according to the present preferred embodiment, the light blocking portion 2d defined by the light absorbing member or the light reflecting member is provided at the lateral walls of the gas cell 2. Therefore, the light that reaches the photodetector 3 without properly passing through the internal space 2a of the gas cell 2 is removed to reduce the noise component for the EIT signal. Thus, a satisfactory EIT signal is able to be obtained. Note that the light absorption coefficient of the light blocking portion 2d is preferably about 23 cm$^{-1}$ or more, for example.

Figure 12:
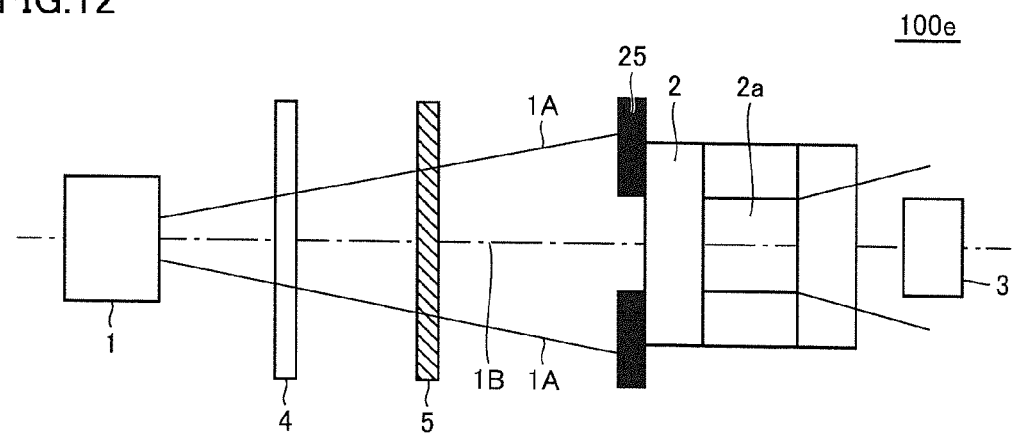
FIG. 12 is a schematic diagram of a modified example of the atomic oscillator according to the third preferred embodiment of the present invention.

Note that, in the atomic oscillator 100c, description is provided of the structure in which the light blocking portion 2d is provided at the lateral walls of the gas cell 2, but the structure is not limited thereto. For example, in the atomic oscillator, a light blocking member to block a portion of the light emitted from the light source so that the portion of the light does not enter the gas cell may be provided between the light source and the gas cell. Specifically, FIG. 12 is a schematic diagram of a modified example of an atomic oscillator 100e according to the third preferred embodiment of the present invention. Note that, in the atomic oscillator 100e, the same or corresponding components as those of the atomic oscillator 100 illustrated in FIG. 1 are represented by the same reference symbols and detailed description thereof is omitted.

In the atomic oscillator 100e illustrated in FIG. 12, a light blocking member 25 is disposed on the entrance side of the gas cell 2. The light blocking member 25 blocks a portion of the light emitted from the light source 1 so that the portion of the light does not enter the gas cell 2, thus blocking the light that reaches the photodetector 3 without properly passing through the internal space 2a of the gas cell 2. The light blocking member 25 may be disposed at any position between the light source 1 and the gas cell 2. For example, the ND filter 5 may be used as the light blocking member 25 by providing a light blocking function to the ND filter 5 so as to block a portion of the light emitted from the light source 1. That is, the ND filter 5 adjusts the intensity of the light that reaches the photodetector 3 by properly passing through the internal space 2a of the gas cell 2 and blocks the light that reaches the photodetector 3 without properly passing through the internal space 2a of the gas cell 2.

Fourth Preferred Embodiment

Figure 13:
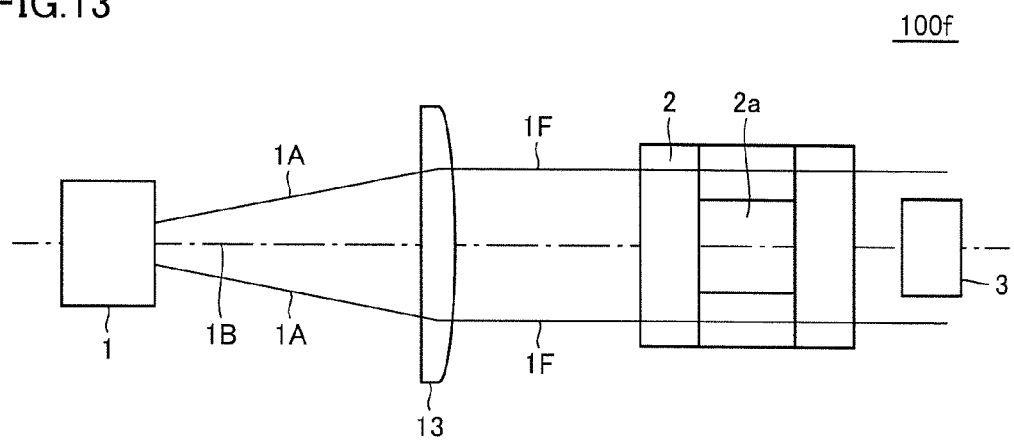
FIG. 13 is a schematic diagram of an atomic oscillator according to a fourth preferred embodiment of the present invention.

In the atomic oscillators described above, it is described that the light emitted from the light source is light that expands until the light reaches the detector. In an atomic oscillator according to a fourth preferred embodiment of the present invention, description is provided of a structure in which the expanding light emitted from the light source is converted into collimated light to pass through the gas cell. FIG. 13 is a schematic diagram of an atomic oscillator 100f according to the fourth preferred embodiment of the present invention. Note that, in the atomic oscillator 100f, the same or corresponding components as those of the atomic oscillator 100 illustrated in FIG. 1 are represented by the same reference symbols and detailed description thereof is omitted.

In the atomic oscillator 100f, an optical member 13, such as a lens, structured to obtain collimated light is disposed between the light source 1 and the gas cell 2. For example, a collimator lens may preferably be as the optical member 13, such as a lens configured to obtain collimated light. In the atomic oscillator 100f, the light converted into collimated light by the optical member 13 passes through the gas cell 2 to reach the photodetector 3. Note that the wave plate 4 and the ND filter 5 are not provided in the atomic oscillator 100f, but may be provided as necessary.

Figure 14A:
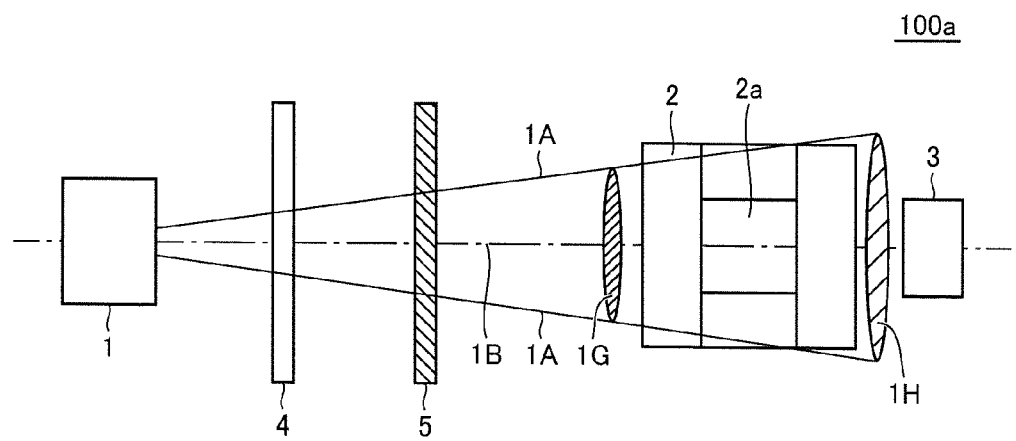
FIGS. 14A and 14B are schematic diagrams for describing a difference in the density of the light intensity depending on the structure of the atomic oscillator.
Figure 14B:
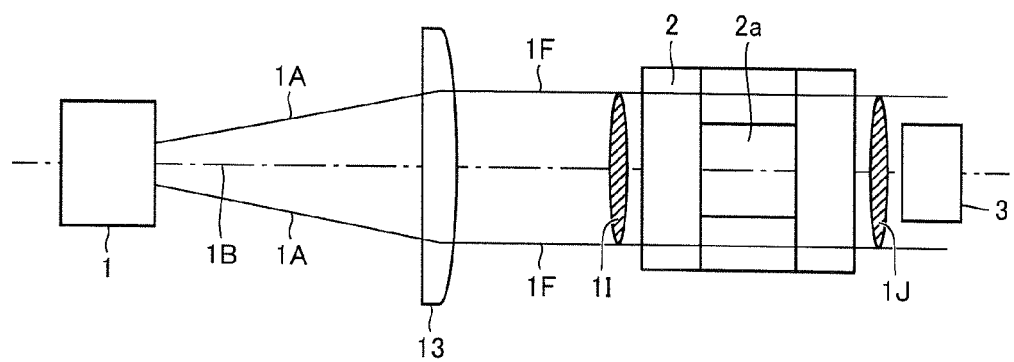

Detailed description is further made of a difference between a case in which the light passing through the gas cell 2 is collimated light and a case in which the light passing through the gas cell 2 is not collimated light. FIGS. 14A and 14B are schematic diagrams for describing a difference in the density of the light intensity depending on the structure of the atomic oscillator. FIG. 14A illustrates the atomic oscillator 100 and the light 1A emitted from the light source 1 is light that expands until the light reaches the photodetector 3. Therefore, when a density 1G of the light intensity on the entrance side of the gas cell 2 and a density 1H of the light intensity on the exit side of the gas cell 2 are compared with each other, the density 1H of the light intensity is lower. Thus, the density of the intensity of the light passing through the internal space 2a of the gas cell 2 changes continuously in the optical axis direction and differs depending on the position of the gas cell 2.

On the other hand, FIG. 14B illustrates the atomic oscillator 100f and the light 1A emitted from the light source 1 is converted into collimated light 1F by the optical member 13 to reach the photodetector 3. Therefore, when a density 1I of the light intensity on the entrance side of the gas cell 2 and a density 1J of the light intensity on the exit side of the gas cell are compared with each other, the densities of the light intensity are the same or substantially the same. Thus, the density of the intensity of the light passing through the internal space 2a of the gas cell 2 is constant or substantially constant in the optical axis direction and does not change depending on the position of the gas cell 2. When the density of the intensity of the light passing through the internal space 2a of the gas cell 2 is constant or substantially constant, a satisfactory EIT signal is able to be obtained because the line width of the EIT signal decreases.

As described above, the atomic oscillator 100f according to the fourth preferred embodiment is able to obtain a satisfactory EIT signal because the optical member 13 to convert the light emitted from the light source 1 into collimated light along the optical axis is further provided between the light source 1 and the gas cell 2. Note that a fly-eye lens may be used if a function of making the light intensity uniform is added to the optical member 13, in addition to the function of converting the expanding light into collimated light.

Fifth Preferred Embodiment

Figure 15:
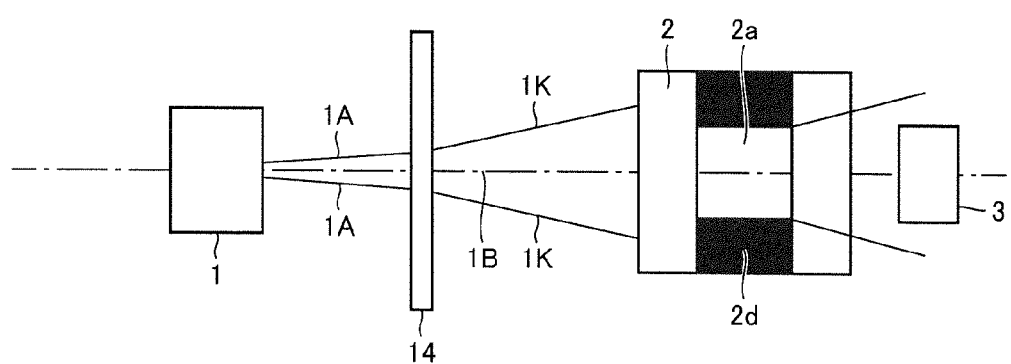
FIG. 15 is a schematic diagram of an atomic oscillator according to a fifth preferred embodiment of the present invention.

In the atomic oscillator 100 according to the first preferred embodiment, description is provided of the structure in which the spot diameter of the light source 1 is increased as a measure to achieve a uniform intensity of the light from the light source 1. In an atomic oscillator according to a fifth preferred embodiment of the present invention, description is provided of a measure to achieve a uniform intensity of the light from the light source 1 by using a diffuser. FIG. 15 is a schematic diagram of an atomic oscillator 100g according to the fifth preferred embodiment of the present invention. Note that, in the atomic oscillator 100g, the same or corresponding components as those of the atomic oscillator 100c illustrated in FIG. 9 are represented by the same reference symbols and detailed description thereof is omitted.

In the atomic oscillator 100g, a diffusion member 14 to diffuse the light emitted from the light source 1 is disposed between the light source 1 and the gas cell 2. For example, a polycarbonate plate may preferably be used as the diffusion member 14. In the atomic oscillator 100g, the light 1A from the light source 1 is converted into diffused light 1K by being diffused by the diffusion member 14. The intensity of the diffused light 1K is made uniform compared with that of the light 1A. Note that the wave plate 4 and the ND filter 5 are not provided in the atomic oscillator 100g but may be provided as necessary.

As described above, in the atomic oscillator 100g, the line width of the EIT signal decreases because the intensity of the light 1A from the light source 1 is made uniform by the diffusion member 14. Thus, a satisfactory EIT signal is able to be obtained. Further, in the atomic oscillator 100g, the increase of the spot diameter of the light source 1 is able to be reduced or prevented because the light intensity is made uniform by the diffusion member 14. When the spot diameter of the light source 1 is increased, it is necessary to secure the distance between the light source 1 and the gas cell 2. Since the light intensity is made uniform by the diffusion member 14, the distance between the light source 1 and the gas cell 2 is able to be reduced, thus enabling downsizing of the atomic oscillator 100g.

In the atomic oscillators according to the preferred embodiments described above, description is provided of the structure in which a resonance frequency is obtained by using the quantum interference effect (CPT). The structure is not limited thereto. As an operation principle of the atomic oscillator, there is a method called a double resonance method that uses light and microwaves. The atomic oscillators according to the preferred embodiments described above may similarly be applied to the double resonance method.

Each of the atomic oscillators according to the preferred embodiments described above may be used as a reference oscillator for an atomic clock and may also be used for an electronic device of a cellular phone base station that requires the reference oscillator and for an electronic device, such as a receiver, that requires positional information to be obtained by using a GPS system, as typified by a cellular phone (smartphone) and a car navigation system, for example. Further, the quantum portion of each of the atomic oscillators according to the preferred embodiments described above may be used as various sensors, such as a magnetic sensor, for example, and may also be used for an electronic device including the quantum portion of the atomic oscillator as the sensor.

In the atomic oscillators according to the preferred embodiments described above, the respective preferred embodiments may freely be combined with each other unless otherwise limited. For example, the structure described in the atomic oscillator 100 according to the first preferred embodiment and the structure described in the atomic oscillator 100g according to the fifth preferred embodiment may be combined with each other. Further, the structure described in the atomic oscillator 100b according to the modified example of the first preferred embodiment and the structure described in the atomic oscillator 100f according to the fourth preferred embodiment may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An atomic oscillator, comprising:
a light source;
a gas cell including an internal space in which an alkali metal atom is sealed; and
a light detecting portion to detect light emitted from the light source and passing through the gas cell; wherein
a radiation region of the light source at a distal end of the gas cell relative to the light source is wider than a sectional area of the internal space.

2. The atomic oscillator according to claim 1, wherein a width of the radiation region of the light source increases toward the light detecting portion.

3. The atomic oscillator according to claim 1, wherein the gas cell comprises:
an entrance window at which the light from the light source enters the gas cell, the entrance window being provided at a proximal end of the gas cell relative to the light source;
an exit window at which the light passing through the internal space exits the gas cell toward the light detecting portion, the exit window being provided at the distal end of the gas cell; and
a lateral wall that defines the entrance window and the exit window; and
the lateral wall includes a light blocking portion defined by a light absorbing member.

4. The atomic oscillator according to claim 3, wherein the light blocking portion has a light absorption coefficient of 23 $cm^{-1}$ or more.

5. The atomic oscillator according to claim 1, further comprising:
a light blocking member to block a portion of the light emitted from the light source so that the portion of the light does not enter the gas cell; wherein
the light blocking member is provided between the light source and the gas cell.

6. The atomic oscillator according to claim 1, further comprising:
an optical member to convert the light emitted from the light source into collimated light along an optical axis; wherein
the optical member is provided between the light source and the gas cell.

7. The atomic oscillator according to claim 1, further comprising:
a diffusion member to diffuse the light emitted from the light source; wherein
the diffusion member is provided between the light source and the gas cell.

8. The atomic oscillator according to claim 1, wherein the optical axis of the light source deviates from a central axis of the gas cell.

9. An atomic oscillator, comprising:
a light source;
a gas cell including an internal space in which an alkali metal atom is sealed; and
a light detecting portion to detect light emitted from the light source and passing through the gas cell; wherein
a portion of the light emitted from the light source enters the gas cell at a proximal end relative to the light source; and
a radiation region of the light source at a distal end of the gas cell relative to the light source is wider than a sectional area of the internal space.

10. The atomic oscillator according to claim 9, wherein the gas cell comprises:
an entrance window at which the light from the light source enters the gas cell, the entrance window being provided at a proximal end of the gas cell relative to the light source;
an exit window at which the light passing through the internal space exits the gas cell toward the light detecting portion, the exit window being provided at the distal end of the gas cell; and a lateral wall that defines the entrance window and the exit window; and the lateral wall includes a light blocking portion defined by a light absorbing member.

11. The atomic oscillator according to claim 10, wherein the light blocking portion has a light absorption coefficient of 23 cm$^{-1}$ or more.

12. The atomic oscillator according to claim 9, further comprising:

a light blocking member to block a portion of the light emitted from the light source so that the portion of the light does not enter the gas cell; wherein the light blocking member is provided between the light source and the gas cell.

13. The atomic oscillator according to claim 9, further comprising:

an optical member to convert the light emitted from the light source into collimated light along an optical axis; wherein the optical member is provided between the light source and the gas cell.

14. The atomic oscillator according to claim 9, further comprising:

a diffusion member to diffuse the light emitted from the light source; wherein the diffusion member is provided between the light source and the gas cell.

15. The atomic oscillator according to claim 9, wherein the optical axis of the light source deviates from a central axis of the gas cell.

16. An electronic device, comprising the atomic oscillator according to claim 1.

17. The electronic device according to claim 16, wherein a width of the radiation region of the light source increases toward the light detecting portion.

18. The electronic device according to claim 16, wherein the gas cell comprises:

an entrance window at which the light from the light source enters the gas cell, the entrance window being provided at a proximal end of the gas cell relative to the light source;

an exit window at which the light passing through the internal space exits the gas cell toward the light detecting portion, the exit window being provided at the distal end of the gas cell; and a lateral wall that defines the entrance window and the exit window; and the lateral wall includes a light blocking portion defined by a light absorbing member.

19. An electronic device, comprising the atomic oscillator according to claim 9.

20. The electronic device according to claim 19, wherein the gas cell comprises:

an entrance window at which the light from the light source enters the gas cell, the entrance window being provided at a proximal end of the gas cell relative to the light source;

an exit window at which the light passing through the internal space exits the gas cell toward the light detecting portion, the exit window being provided at the distal end of the gas cell; and a lateral wall that defines the entrance window and the exit window; and the lateral wall includes a light blocking portion defined by a light absorbing member.

* * * * *